(12) United States Patent
Jameson

(10) Patent No.: US 12,113,501 B2
(45) Date of Patent: Oct. 8, 2024

(54) ULTRA-WIDEBAND ATTENUATOR WITH LOW PHASE VARIATION AND IMPROVED STABILITY WITH RESPECT TO TEMPERATURE VARIATIONS

(71) Applicant: RAFAEL ADVANCED DEFENSE SYSTEMS LTD., Haifa (IL)

(72) Inventor: Samuel Jameson, Binyamina (IL)

(73) Assignee: RAFAEL ADVANCED DEFENSE SYSTEMS LTD., Haifa (IL)

( * ) Notice: Subject to any disclaimer, the term of this patent is extended or adjusted under 35 U.S.C. 154(b) by 53 days.

(21) Appl. No.: 17/769,898

(22) PCT Filed: Nov. 29, 2020

(86) PCT No.: PCT/IL2020/051231
§ 371 (c)(1),
(2) Date: Apr. 18, 2022

(87) PCT Pub. No.: WO2021/111434
PCT Pub. Date: Jun. 10, 2021

(65) Prior Publication Data
US 2022/0376678 A1 Nov. 24, 2022

(30) Foreign Application Priority Data
Dec. 1, 2019 (IL) .......................................... 271075

(51) Int. Cl.
*H03H 11/24* (2006.01)
(52) U.S. Cl.
CPC ................ *H03H 11/245* (2013.01)
(58) Field of Classification Search
None
See application file for complete search history.

(56) References Cited

U.S. PATENT DOCUMENTS

| 7,528,677 B2 * | 5/2009 | Yan ........................... H03F 1/30 333/81 R |
| 8,779,870 B2 | 7/2014 | Sun et al. |
| (Continued) | | |

OTHER PUBLICATIONS

PCT International Search Report for corresponding Application No. PCT/IL2020/051231, mailed Mar. 7, 2021, 3 pages.

(Continued)

*Primary Examiner* — Cassandra F Cox
(74) *Attorney, Agent, or Firm* — Dority & Manning, P.A.

(57) ABSTRACT

A method for improving the stability and reducing phase variations of an ultra-wideband attenuator, with respect to temperature variations, comprising the steps of providing an attenuator implemented in π-topology and consisting of a serial path between the input and the output of the attenuator, including a first serial resistor $Rs_1$ connected to the input, followed by a serial inductor Ls, followed by a second serial resistor $Rs_2$ connected to the output; a first transistor $T_1$ bridging between the input and the output, for controlling the impedance of the serial path by a first control input provided to the first transistor $T_1$; a first parallel path between the input and ground, including a first parallel transistor $T_{2a}$ followed by first parallel resistor $Rp_1$; a second parallel path between the output and ground, including a second parallel transistor $T_{2b}$ followed by second parallel resistor $Rp_2$; a second control input commonly provided to first parallel transistor $T_{2a}$ and to the second parallel transistor $T_{2b}$, for controlling the impedance of the first and second parallel paths; unifying the serial resistors to a common serial resistor Rs and splitting the serial inductor Ls to two serial inductors $Ls_1$ and $Ls_2$, such that one serial inductor is connected between the input and a first contract of the common serial resistor Rs and the other serial inductor is connected between the output and the other contact of the (Continued)

common serial resistor Rs; splitting the parallel resistor $Rp_1$ to two smaller resistors, connecting a first smaller resistor to the input, connecting a second smaller resistor to the first smaller resistor via the first parallel transistor $T_{2a}$ and to ground via a third parallel transistor $T_{3a}$; splitting the parallel resistor $Rp_2$ to two smaller resistors, connecting a third smaller resistor to the output, connecting a fourth smaller resistor to the third smaller resistor via the second parallel transistor $T_{2b}$ and to ground via a fourth parallel transistor $T_{3b}$; connecting a first feedback capacitor $Cfb_1$ between the common point connecting between the ungrounded port of the second parallel transistor $T_{3a}$ and the first contract of the common serial resistor Rs and connecting a second feedback capacitor $Cfb_2$ between the common point connecting between the ungrounded port of the fourth parallel transistor $T_{3b}$ and the second contract of the common serial resistor Rs; upon controlling the first and second parallel transistors $T_{2a}$ and $T_{2b}$ by the second control input, simultaneously controlling also the third and the fourth parallel transistors $T_{3a}$ and $T_{3b}$ by the second control input; controlling the first and the second control inputs to obtain a desired attenuation between the input and output of the attenuator.

14 Claims, 19 Drawing Sheets

(56) References Cited

U.S. PATENT DOCUMENTS

| | | | |
|---|---|---|---|
| 9,374,078 B2* | 6/2016 | Bawell | H03G 1/007 |
| 10,291,208 B1 | 5/2019 | Shrivastrava et al. | |
| 2011/0140755 A1 | 6/2011 | Hong et al. | |
| 2016/0134259 A1 | 5/2016 | Shrivastrava et al. | |
| 2018/0102763 A1 | 4/2018 | Lam | |

OTHER PUBLICATIONS

Bae et al., "A 10-67-GHz CMOS Dual-Function Switching Attenuator with Improved Flatness and Large Attenuation Range", IEEE Transactions on Microwave Theory and Techniques, vol. 61, No. 12, Dec. 2013, pp. 4118-4129.

Davulcu et al., "7-Bit SiGe-BiCMOS Step Attenuator for X-Band Phased-Array RADAR Applications", IEEE Microwave and Wireless Components Letters, vol. 26, No. 8, Aug. 2016, pp. 598-600.

Ku et al., "6-bit CMOS Digital Attenuators with Low Phase Variations for X-Band Phased-Array Systems", IEEE Transactions on Microwave Theory and Techniques, vol. 58, No. 7, Jul. 2010, pp. 1651-1663.

Min et al., "A 10-50-GHz CMOS Distributed Step Attenuator with Low Loss and Low Phase Imbalance", IEEE Journal of Solid-State Circuits, vol. 42, No. 11, Nov. 2007, pp. 2547-2554.

Extended European Search Report received in corresponding Application No. 20896810.7, dated Aug. 14, 2023, 5 pages.

* cited by examiner

ULTRA-WIDEBAND ATTENUATOR WITH LOW PHASE VARIATION AND IMPROVED STABILITY WITH RESPECT TO TEMPERATURE VARIATIONS

CROSS-REFERENCE TO RELATED APPLICATIONS

The present application is a national phase application of International Application No. PCT/IL2020/051231, filed Nov. 29, 2020, which, in turn, claims the right of priority to Israeli Patent Application No. 271075, filed Dec. 1, 2019, the disclosures of both of which are hereby incorporated by reference herein in their entireties for all purposes.

FIELD OF THE INVENTION

The present invention relates to the field of RF phased-array systems. More particularly, the invention relates to an ultra-wideband attenuator with low phase variation and improved stability, with respect to temperature variations.

BACKGROUND OF THE INVENTION

Phased-array radars are widely used both in civil and military industries. These radars are generally created by a large repetition of RF transmitting (Tx) and receiving (Rx) "unit" channels connected to antennas. The ability to independently modify the phase and amplitude of each channel (such that modifying each channel does not affect the other channels) allows beam-forming and beam-steering, thereby leading to numerous applications such as imaging, sensing and data transferring.

These transmitting (Tx) and receiving (Rx) channels integrates at least one attenuator to realize the beam-forming (a signal processing technique used in sensor arrays for directional signal transmission or reception by combining elements in an antenna array in such a way that signals at particular angles experience constructive interference while others experience destructive interference) and a phase shifter to realize the beam-steering (changing the direction of the main lobe of a radiation pattern by switching the antenna elements or by changing the relative phases of the RF signals driving the elements). These two components represent the core RF function of any phased-array system and must have orthogonal effects on each other.

A typical phased array system basically consists of two major components: the phase shifter realizing the beam-steering and the attenuator realizing the beam-forming. A common problem faced in these systems lies in the non-orthogonal behavior of these two main components. The non-orthogonality of these two components is at the core of the complex calibration process and the phased array accuracy limitation.

Attenuators introduce unwanted phase differences between different attenuation values, known as phase variation or phase imbalance. Phase shifters have unwanted amplitude differences between different phase values, known as an amplitude imbalance. However, in order to accurately shape and steer the RF radiated beam in the desired direction, this large repetition of RF channels must have similar amplitude and phase control between them and must be originally calibrated to a common "reference". This is normally realized by calibrating the system both in-phase and amplitude, or more explicitly, by individually and independently calibrating each channel. However, such an iterative calibration process can be tedious, especially when taking into account many factors such as frequency, process, module integration and temperature variations. Therefore, the trade-off between performance and calibration complexity is a major limiting factor of the phased-array system accuracy.

FIG. 1 shows an example of the error introduced when changing an arbitrary phase and amplitude in a phased array channel. The introduced error from the non-orthogonality of the phase-shifter and the attenuator requires an iterative calibration process, the complexity of which is directly linked to the attenuator phase imbalance and phase shifter amplitude imbalance values and variations with respect to other parameters (i.e., temperature variations).

Due to these problems, the attenuator used for beam-forming is often designed with the lowest phase variation over different attenuations possible, to reduce the overall phase error of the phased-array. Such attenuators present in a general trade-off, especially in terms of frequency bandwidth [1-3].

Attenuators can have digital or analog controls. The main advantage of an analog attenuator lies in its virtually unlimited accuracy. However, such accuracy requires the provisioning of very accurate and constant DC supply values to a very large of number channels, chips and modules. The difficulty to implement this solution entails variation of linearity over attenuation values, and therefore, using it may be problematic.

On the other hand, digital attenuator often suffers from minimum attenuation accuracy but offer much higher linearity thanks to stacked transistors topologies [3]. Following these considerations, the solution proposed by the present invention is based on a digitally controlled attenuator type, so as to improve phased-array systems performances.

Digitally Controlled Attenuators (DCAs) are generally composed of a decimal combination of bits [1] or succession of unit bit values [2]. In order to get an overall low phase error over different attenuations, each bit must have even a lower phase error.

FIG. 2 illustrates the basic architecture of a Digitally-Controlled-Attenuator (DCA). As shown, in a 6 bits DCA, a relatively small error of 1.5° in a single bit introduces a 9° error, while many phased-array systems require a lowest significant bit (LSB) of phase accuracy of 5.6°. To avoid such unwanted phase variations, attenuators are often designed with a compensating element to correct this phase imbalance introduced by the phase difference between the attenuating state and the non-attenuating state of each attenuation bit.

Digital attenuators are implemented using two main topologies: T-Topology and π-topology. Both topologies have a similar dynamic range of attenuation performance. However, π-topology is often preferred due to their larger resistor values, smaller in size and introducing less reactance.

FIGS. 3A and 3B (prior art) illustrate improved T- and π-networks-based attenuators, respectively, with low phase variation for different attenuations over large frequency range reported [4-5]. There is a trade-off between frequency bandwidth and phase variation. The phase difference (considered as a variation error) between the attenuating path and non-attenuating path of T- and π-topologies lies in the introduction of a "bridged" (or serial) transistor $T_1$ and "branch" (or parallel) transistor $T_2$ used in their respective paths.

The off-state capacitance of these transistors, in their respective states, introduces a phase error between them. This phase error is even often magnified by the large size of the bridged transistor $T_1$, used for reducing the attenuator's insertion loss as much as possible.

In order to compensate for the introduced phase error, a reactive element (capacitor "Cp" for T topology or inductor "Ls" for π-topology) can be added into the branch or bridge paths, for correcting the phase of the attenuation state back to the reference path.

FIG. 4 schematically shows a trade-off that exists between the phase variation and the attenuation value over frequency, both limiting the maximum frequency and bandwidth of the attenuator. The compensating reactive element (Cp or Ls) distorts the amplitude response of the path into which it is embedded. This results into a frequency-dependent attenuation value, defined as an attenuation error. This attenuation error limits the maximum frequency of operation of the attenuator and the frequency bandwidth.

FIGS. 5a and 5b show analysis results of the correction capacitor "Cp" in the T-topology (of FIG. 3) regarding attenuation and phase imbalance, respectively, using only lumped elements and transistors from a CMOS 180 nm technology.

FIGS. 6a and 6b show analysis results of the correction inductor "Ls" in the π-topology (of FIG. 3) regarding attenuation and phase imbalance, respectively, using only lumped elements and transistors from a CMOS 180 nm technology.

As can be seen, as the value of the reactive correction element (Cp or Ls) grows, the phase imbalance is reduced at the cost of the attenuation value over frequency (i.e., increasing attenuation error). It can also be observed that they are directly correlated and follow always the same direction, meaning that increasing the value of the reactive component will always deteriorate the attenuation value over frequency.

The phase imbalance is actually way more significant than shown in FIGS. 5a-5b and 6a-6b when taking into account the real physical design elements (capacitor, inductor, resistors and connectivity lines) and their parasitic through an electro-magnetic simulator such as Calibre PEX (Mentor Graphics, OR, U.S.A.) or Momentum (Keysight Technologies, Inc., CA, U.S.A.).

It is therefore an object of the present invention to provide an ultra-wideband attenuator with low phase variation and improved stability, with respect to temperature variations.

It is another object of the present invention to provide an ultra-wideband attenuator which reduces the trade-off between attenuation value and phase variation over frequency.

Other objects and advantages of the invention will become apparent as the description proceeds.

SUMMARY OF THE INVENTION

A method for improving the stability and reducing phase variations of an ultra-wideband attenuator, with respect to temperature variations, comprising the steps of:
a) providing an attenuator implemented in π-topology and consisting of:
  a.1) a serial path between the input and the output of the attenuator, including a first serial resistor $Rs_1$ connected to the input, followed by a serial inductor Ls, followed by a second serial resistor $Rs_2$ connected to the output;
  a.2) a first transistor $T_1$ bridging between the input and the output, for controlling the impedance of the serial path by a first control input provided to the first transistor $T_1$;
  a.3) a first parallel path between the input and ground, including a first parallel transistor $T_{2a}$ followed by first parallel resistor $Rp_1$;
  a.4) a second parallel path between the output and ground, including a second parallel transistor $T_{2b}$ followed by second parallel resistor $Rp_2$;
  a.5) a second control input commonly provided to first parallel transistor $T_{2a}$ and to the second parallel transistor $T_{2b}$ for controlling the impedance of the first and second parallel paths;
b) rearranging the components in the serial path by unifying the serial resistors to a common serial resistor Rs and splitting the serial inductor Ls to two serial inductors $Ls_1$ and $Ls_2$, such that one serial inductor is connected between the input and a first contract of the common serial resistor Rs and the other serial inductor is connected between the output and the other contact of the common serial resistor Rs;
c) modifying the components in the first parallel path by splitting the parallel resistor $Rp_1$ to two smaller resistors, connecting a first smaller resistor to the input, connecting a second smaller resistor to the first smaller resistor via the first parallel transistor $T_{2a}$ and to ground via a third parallel transistor $T_{3a}$;
d) modifying the components in the second parallel path by splitting the parallel resistor $Rp_2$ to two smaller resistors, connecting a third smaller resistor to the output, connecting a fourth smaller resistor to the third smaller resistor via the second parallel transistor $T_{2b}$ and to ground via a fourth parallel transistor $T_{3b}$;
e) connecting a first feedback capacitor $Cfb_1$ between the common point connecting between the ungrounded port of the second parallel transistor $T_{3a}$ and the first contract of the common serial resistor Rs and connecting a second feedback capacitor $Cfb_2$ between the common point connecting between the ungrounded port of the fourth parallel transistor $T_{3b}$ and the second contract of the common serial resistor Rs;
f) upon controlling the first and second parallel transistors $T_{2a}$ and $T_{2b}$ by the second control input, simultaneously controlling also the third and the fourth parallel transistors $T_{3a}$ and $T_{3b}$ by the second control input; and
g) controlling the first and the second control inputs to obtain a desired attenuation between the input and output of the attenuator.

The transistors may be implemented using MOSFET technology. The attenuator may be implemented using differential or single-ended topology.

The circuitry for implementing the attenuator may be symmetrical, such that:
$Rs_1=Rs_2$;
$Rp_1=Rp_2$;
first smaller resistor=third smaller resistor;
second smaller resistor=fourth smaller resistor.

Optimal performance may be obtained when the resistors are split into two equal smaller resistors.

The phase imbalance may be corrected while the attenuation value decreases.

Essentially constant attenuation is obtained from DC-26 GHz.

An ultra-wideband attenuator with improved stability and reduced phase variations, with respect to temperature variations, comprising:
a) an attenuator implemented in π-topology consisting of:
  a.1) a serial path between the input and the output of the attenuator, including a first serial resistor $Rs_1$ connected to the input, followed by a serial inductor Ls, followed by a second serial resistor $Rs_2$ connected to the output;

a.2) a first transistor $T_1$ bridging between the input and the output, for controlling the impedance of the serial path by a first control input provided to the first transistor $T_1$;

a.3) a first parallel path between the input and ground, including a first parallel transistor $T_{2a}$ followed by first parallel resistor $Rp_1$;

a.4) a second parallel path between the output and ground, including a second parallel transistor $T_{2b}$ followed by second parallel resistor $Rp_2$;

a.5) a second control input commonly provided to first parallel transistor $T_{2a}$ and to the second parallel transistor $T_{2b}$ for controlling the impedance of the first and second parallel paths;

b) a common serial resistor Rs in the serial path being the unification of the serial resistors and two serial inductors $Ls_1$ and $Ls_2$, being a division of the serial inductor Ls, such that one serial inductor is connected between the input and a first contract of the common serial resistor Rs and the other serial inductor is connected between the output and the other contact of the common serial resistor Rs;

c) a first resistor being smaller than $Rp_1$ connected to the input and a second smaller resistor being smaller than $Rp_1$ connected to the first smaller resistor via the first parallel transistor $T_{2a}$ and to ground via a third parallel transistor $T_{3a}$;

d) a third resistor being smaller than $Rp_2$ connected to the input and a second smaller resistor being smaller than $Rp_2$ connected to the first smaller resistor via the first parallel transistor $T_{2b}$ and to ground via a third parallel transistor $T_{3b}$;

e) a first feedback capacitor $Cfb_1$ connected between the common point connecting between the ungrounded port of the second parallel transistor $T_{3a}$ and the first contract of the common serial resistor Rs and a second feedback capacitor $Cfb_2$ connecting between the common point connecting between the ungrounded port of the fourth parallel transistor $T_{3b}$ and the second contract of the common serial resistor Rs;

f) a controller adapted to control the first and second parallel transistors $T_{2a}$ and $T_{2b}$ by the second control input, to simultaneously control also the third and the fourth parallel transistors $T_{3a}$ and $T_{3b}$ by the second control input; and to control the first and the second control inputs to obtain a desired attenuation between the input and output of the attenuator.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 4:
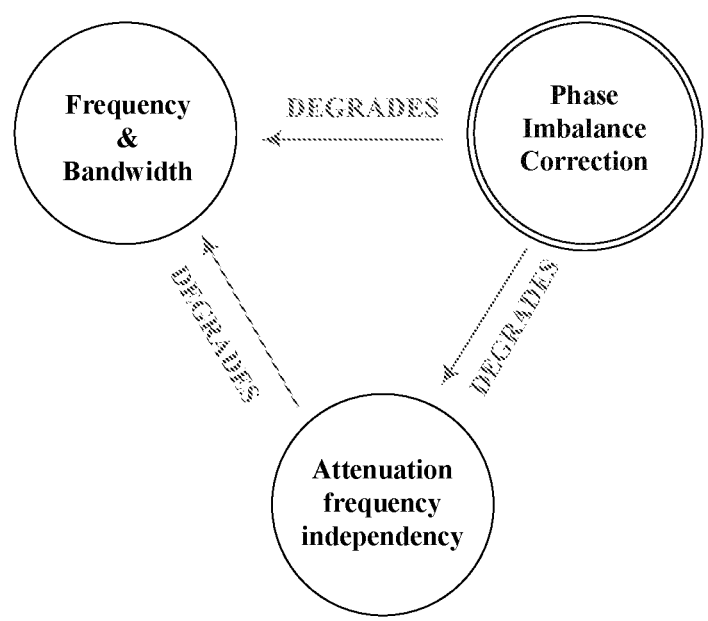
FIG. 4 schematically shows a trade-off that exists between the phase variation and the attenuation value over frequency, both limiting the maximum frequency and bandwidth of the attenuator.
Figure 5A:
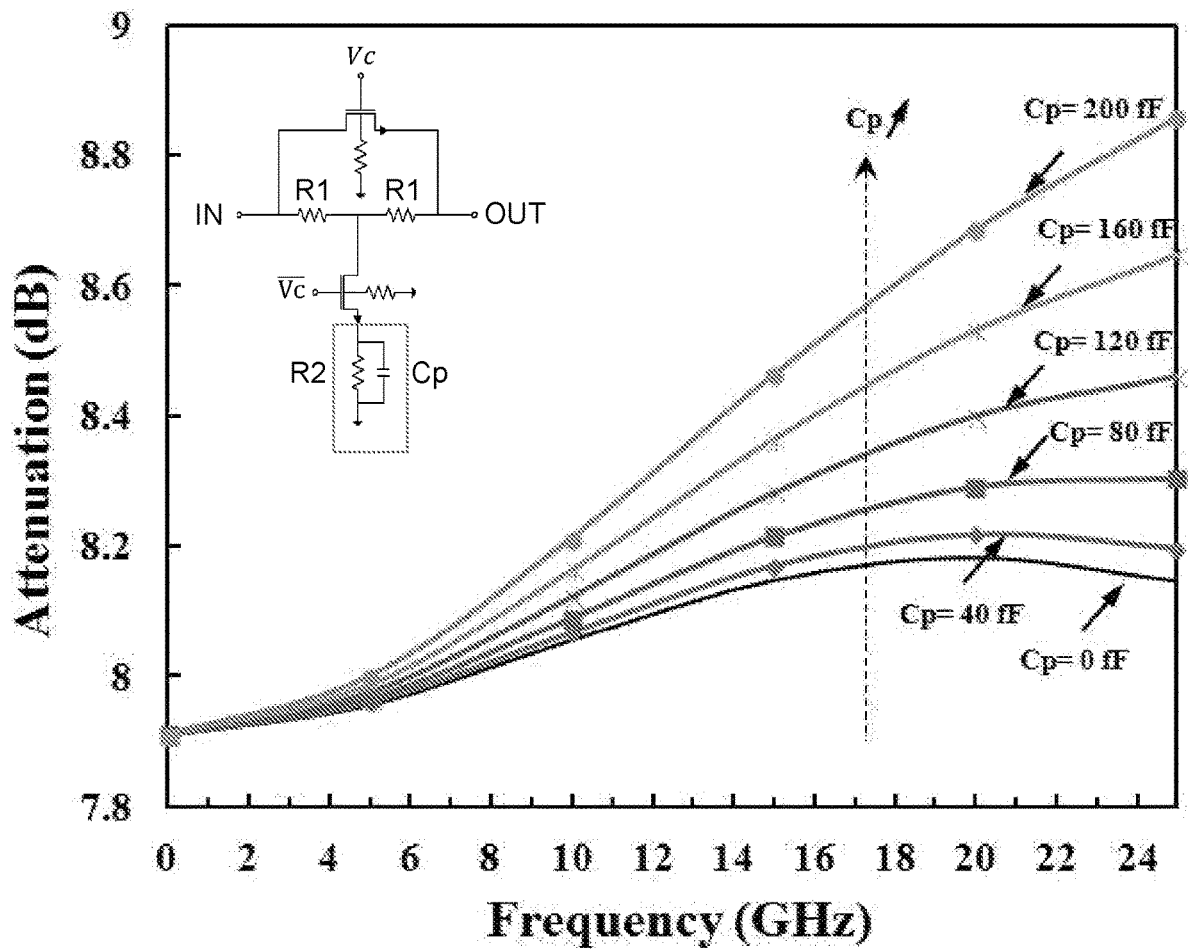
FIGS. 5a and 5b show analysis results of the correction capacitor in the T-topology of FIG. 3 regarding attenuation and phase imbalance, respectively, using only lumped elements and transistors from a CMOS 180 nm technology.
Figure 5B:
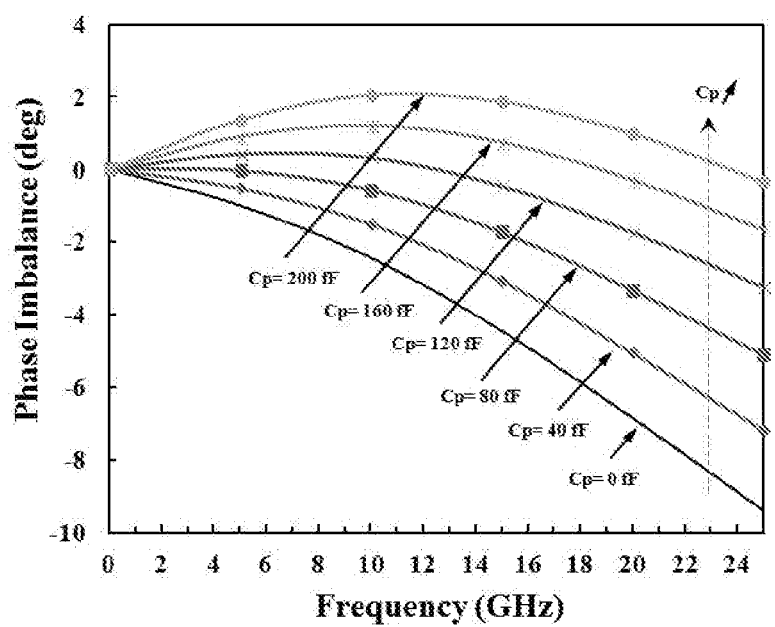
Figure 6A:
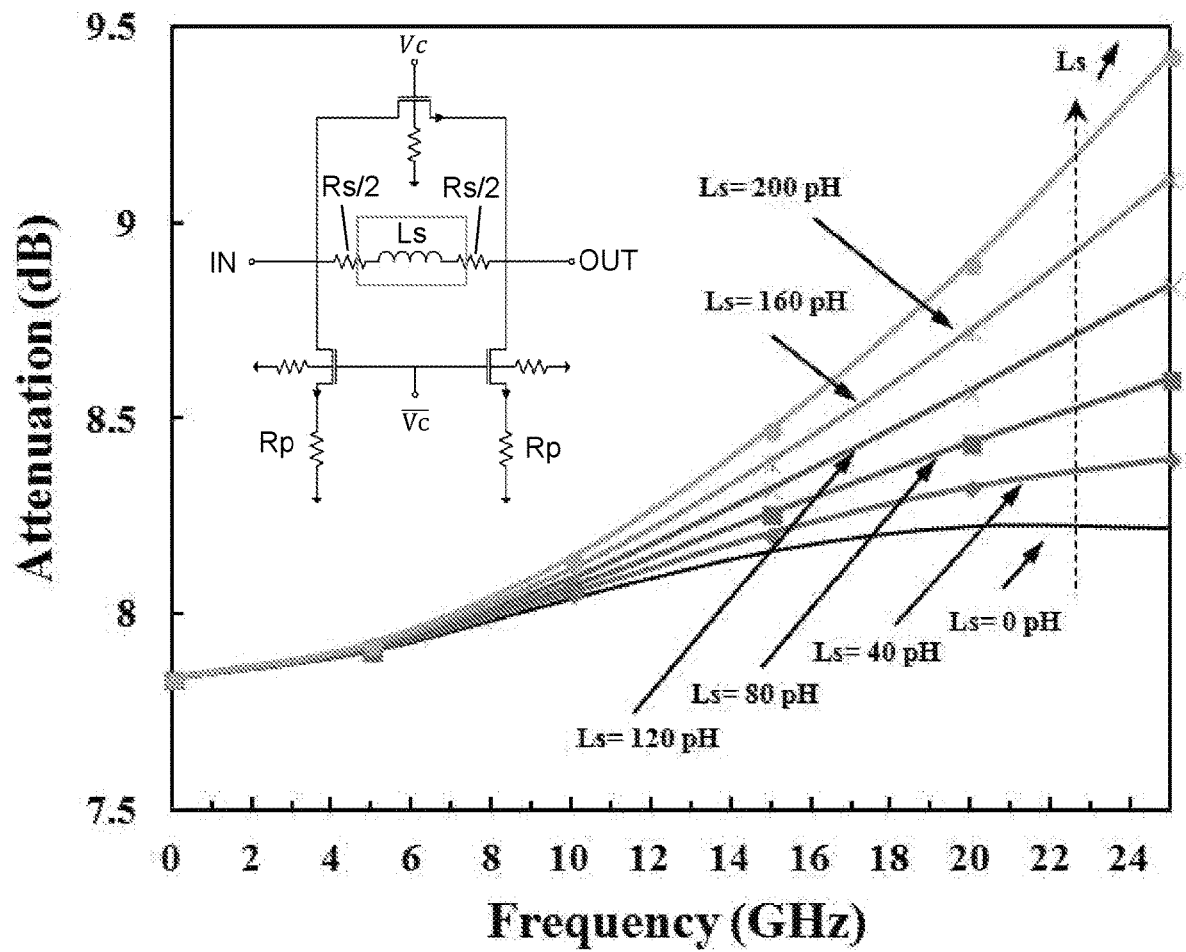
FIGS. 6a and 6b show analysis results of the correction inductor "Ls" in the π-topology (of FIG. 3) regarding attenuation and phase imbalance, respectively, using only lumped elements and transistors from a CMOS 180 nm technology
Figure 6B:
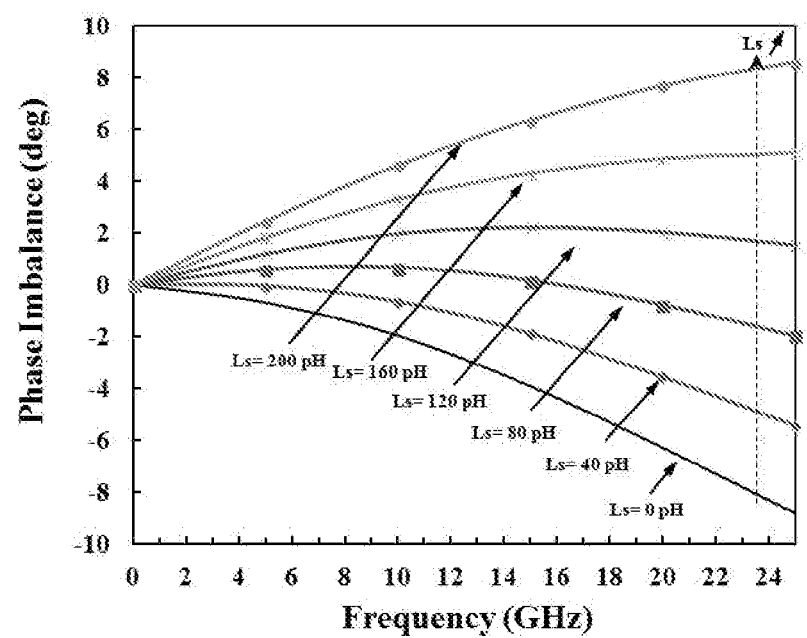

The present invention proposes a technique for improving the phased-array system accuracy by reducing this amplitude and phase calibration process of large phased-array systems by using an attenuator with very low phase variation and improved stability, with respect to temperature variations over ultra-wideband frequencies, with excellent matching. The proposed technique proposes a method and circuit for further improving the basic π-topology, in order to break the trade-off shown in FIG. 4.

In one embodiment, a basic π-topology attenuator was chosen over a basic T-topology attenuator.

Figure 7:
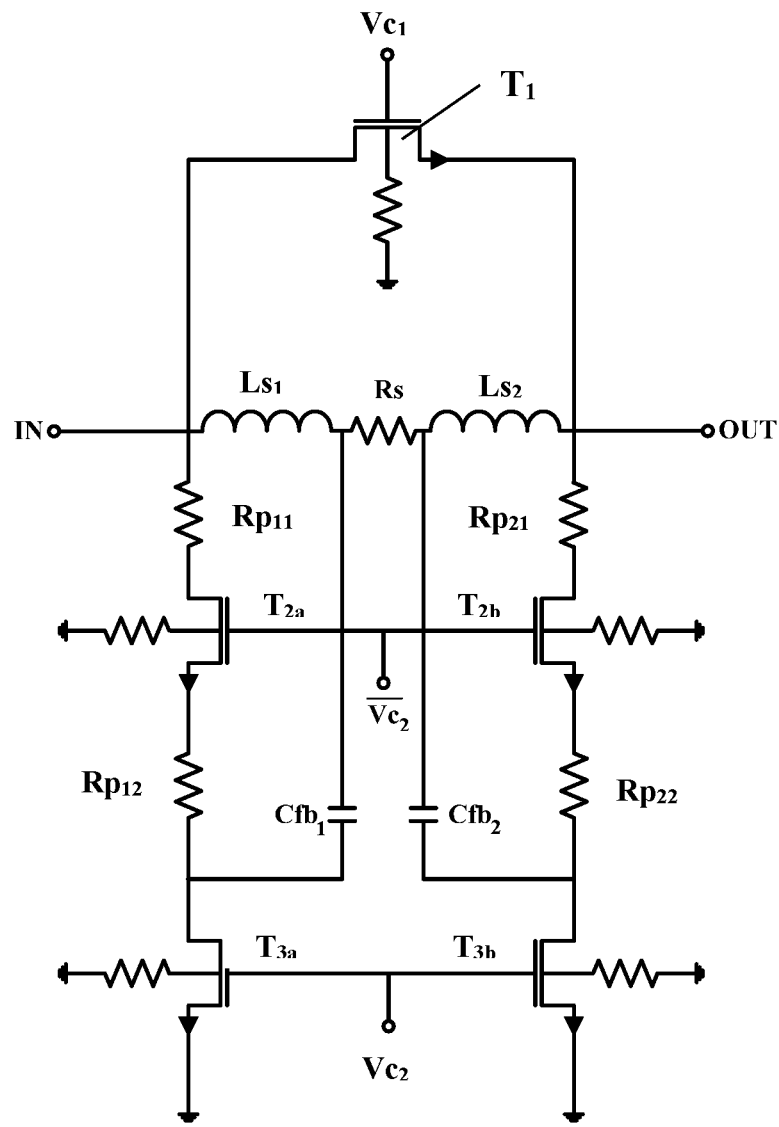
FIG. 7 illustrates an implementation topology of an attenuation bit, according to an embodiment of the invention.

FIG. 7 illustrates an implementation topology of an attenuation bit, according to an embodiment of the invention. This new topology improves the phase variation over temperature, attenuation error over frequency and linearity, as will be explained later on.

In general, a single resistor Rp is used in the branch or parallel path to correct the attenuation value. It was surprisingly found that the distribution of this resistor to Rp1 and Rp2 improves the phase variation of the attenuator and reduces the attenuation error over frequency.

Figure 8A:
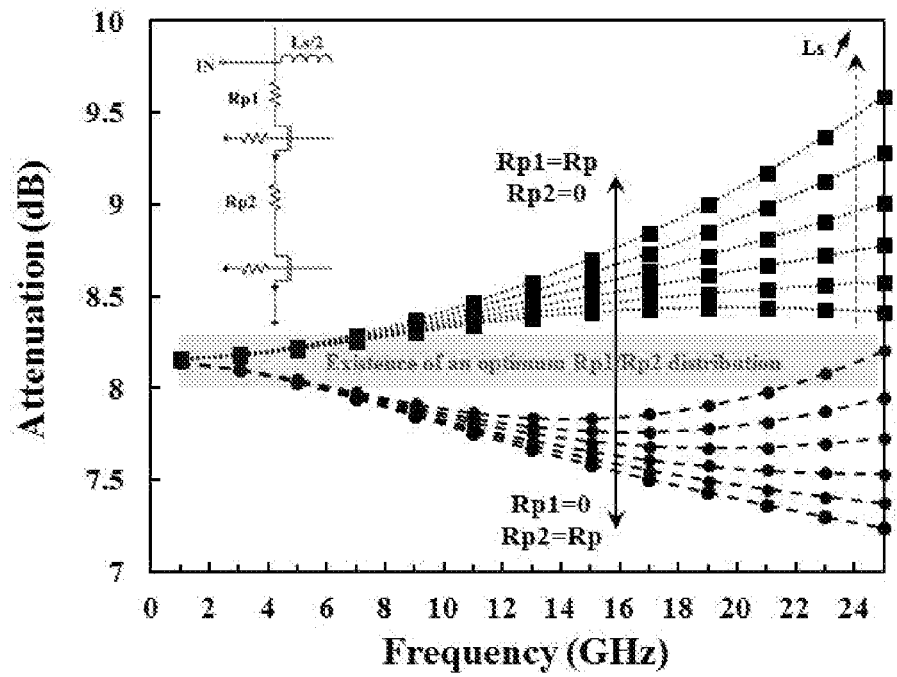
FIGS. 8a and 8b show analysis results of the distribution values of the parallel resistors Rp between Rp1 and Rp2.
Figure 8B:
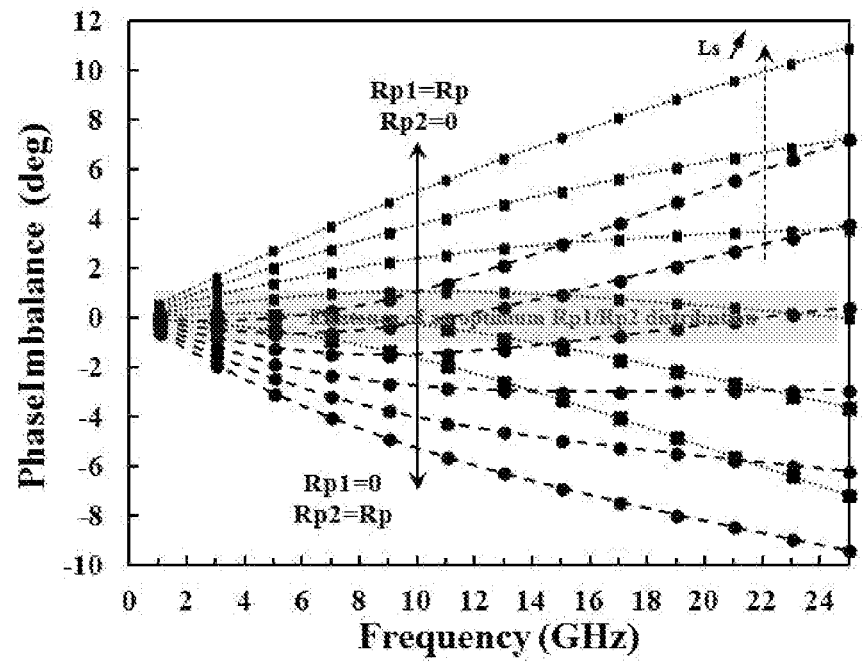

FIGS. 8a and 8b show analysis results of the distribution values of the parallel resistors Rp between Rp1 and Rp2. FIG. 8a shows changes in the attenuation value over frequency for different distribution values of Rp1 and Rp2 in the range of o<Rp1, Rp2<Rp. FIG. 8b shows changes in the phase error (phase imbalance) over frequency for different distribution values of Rp1 and Rp2 in the range of o<Rp1, Rp2<Rp. As shown, there exists an optimum distribution between Rp1 and Rp2.

In addition, compared to a basic π-topology, another transistor Trp2 was added in each branch path, for improving the linearity of the attenuator, as shown in FIG. 7. This second transistor (Trp2) plays as well another core function: at OFF-state, it introduces capacitance with a high impedance to the ground. Enhanced by the OFF-state capacitance of second branch transistors (Trp2), a feedback path has been introduced from the branch (or parallel) path to the bridge (or serial) path by a capacitor Cfb (shown in FIG. 7), thereby correcting the phase variation while decreasing the attenuation value.

It is important to state that the feedback found would still work without Trp2 if Trp1 and Rp1 would be switched, however, it would work with diminished effect and would lose the advantage of the resistors Rp1/Rp2 distribution resulting in overall smaller bandwidth and maximum operating frequency.

Figure 9A:
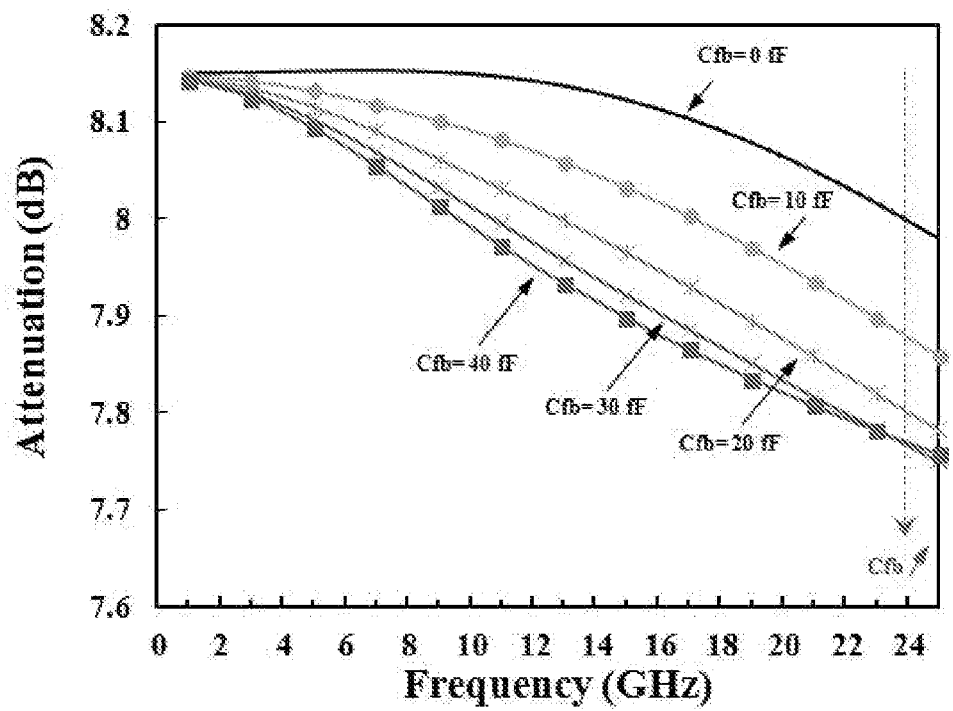
FIGS. 9a and 9b show analysis results of the effect of the feedback capacitance Cfb.
Figure 9B:
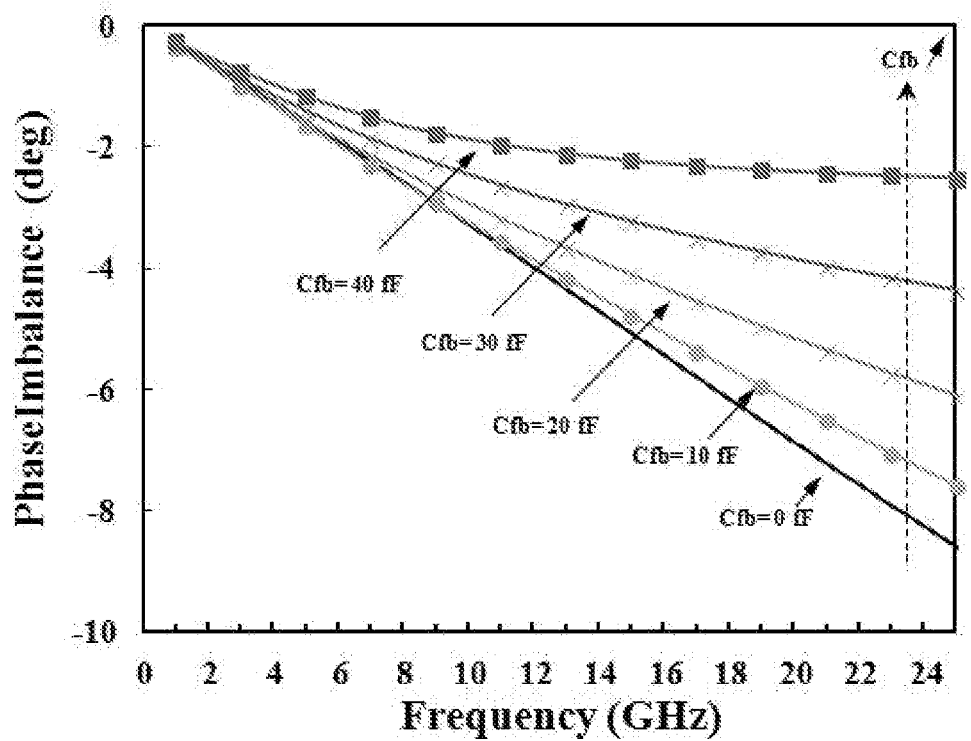

FIGS. 9a and 9b show analysis results of the effect of the feedback capacitance Cfb. FIG. 9a shows changes in the attenuation value over frequency for different values of Cfb. FIG. 9b shows changes in the phase error (phase imbalance) over frequency for different values of Cfb.

As can be seen, the phase imbalance is corrected while the attenuation value decreases. Using the combination of 2 correcting elements with opposite behavior (i.e., varying the attenuation value and phase imbalance in opposite directions) on the attenuation value, while both correcting the phase will lead to the possibility of designing an attenuator with very low phase variation and still acceptable attenuator error value over ultra-wideband frequencies.

Figure 10A:
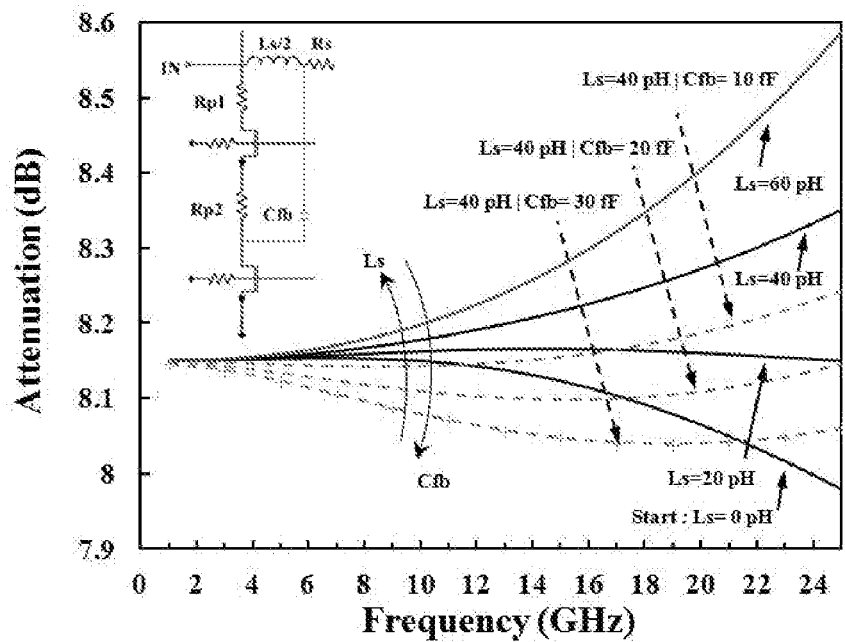
FIGS. 10a and 10b show analysis results of phase variation and attenuation value optimization over frequency for different combinations of Cfb and Ls.
Figure 10B:
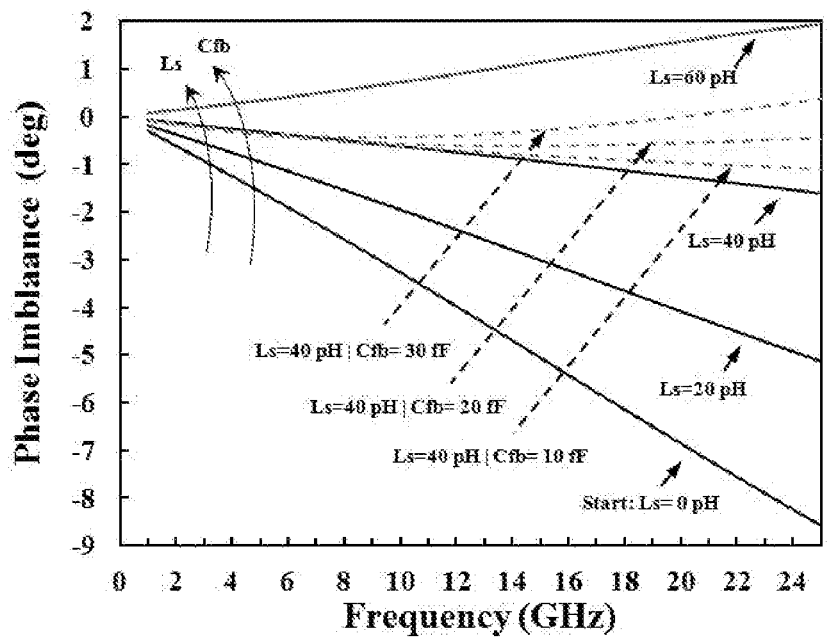

FIGS. 10a and 10b show analysis results of phase variation and attenuation value optimization over frequency for different combinations of Cfb and Ls. FIG. 10a shows changes in the attenuation value over frequency for different combinations of Cfb and Ls. FIG. 10b shows changes in the phase error (phase imbalance) over frequency for different combinations of Cfb and Ls.

Figure 3A:
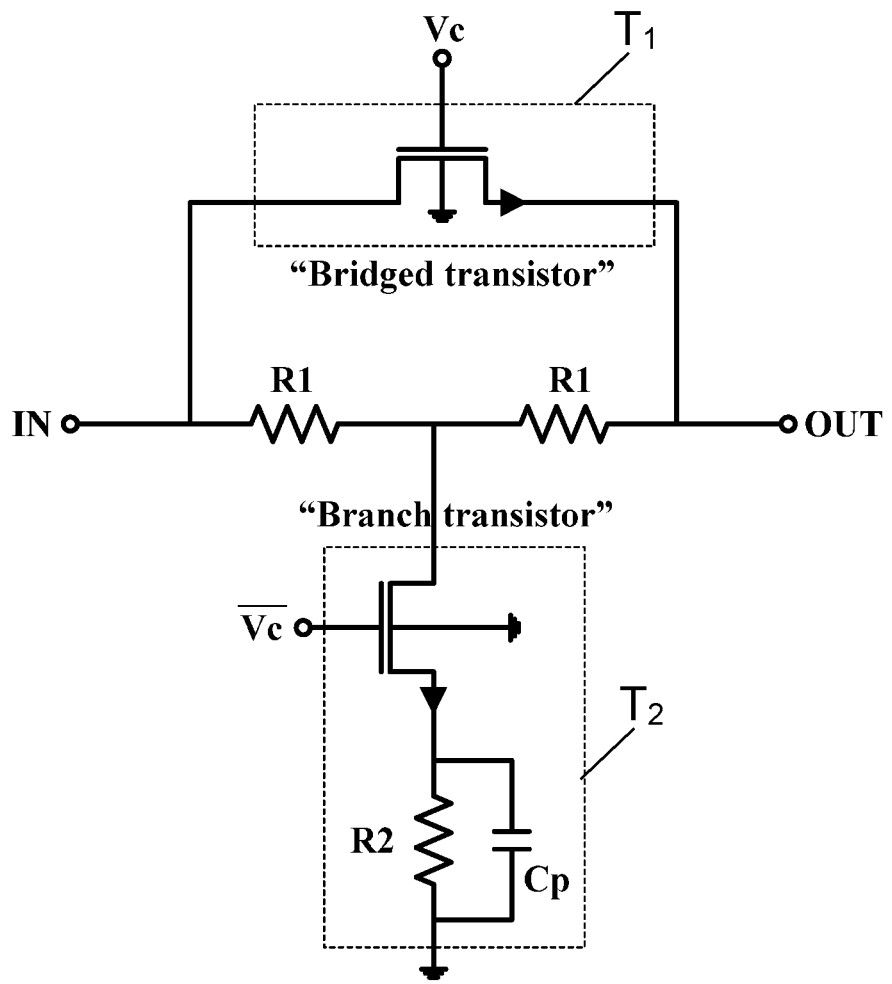
FIGS. 3A and 3B (prior art) illustrate improved T- and π-networks-based attenuators, respectively, with low phase variation for different attenuations over large frequency range reported.
Figure 3B:
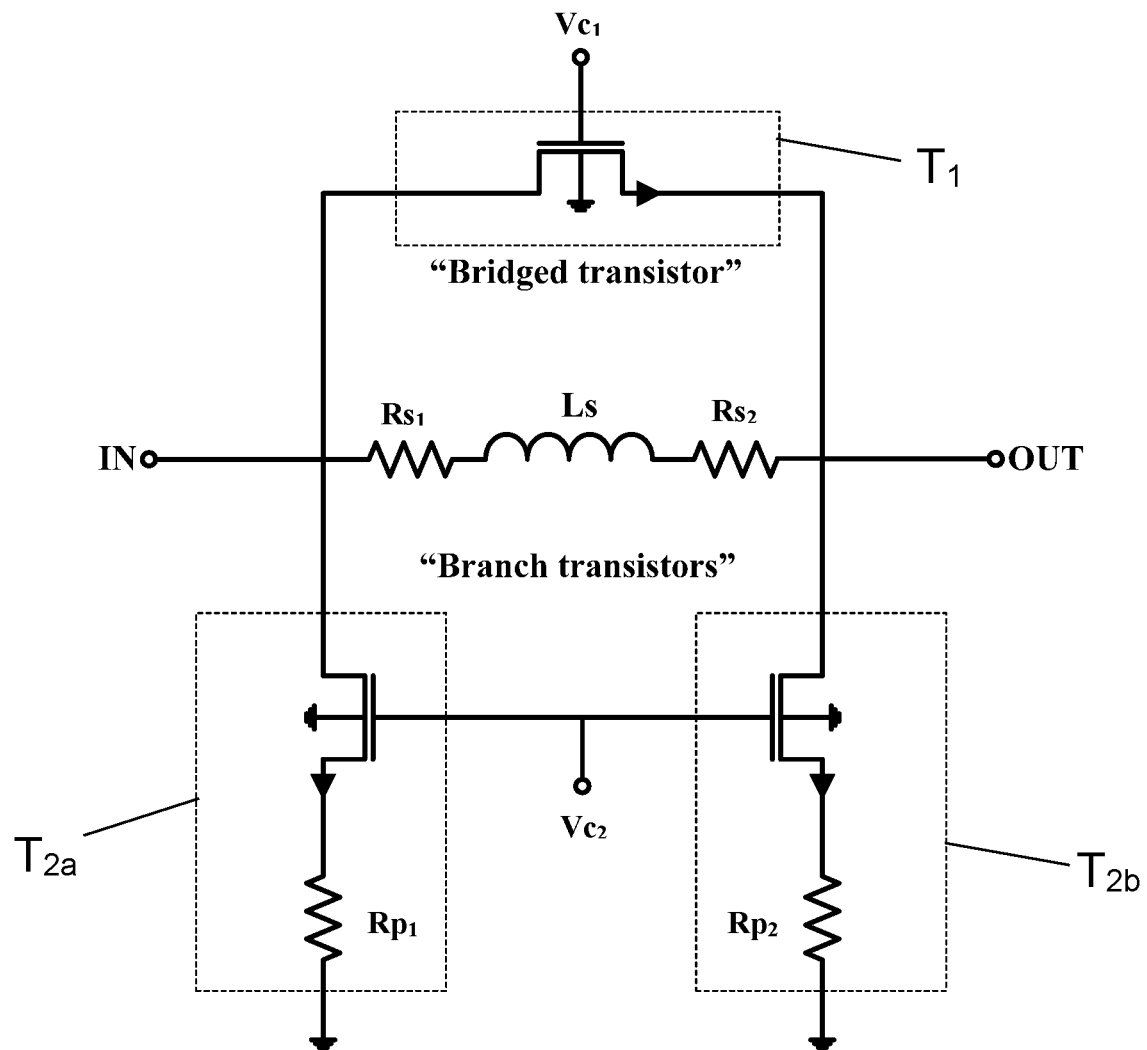
Figure 11A:
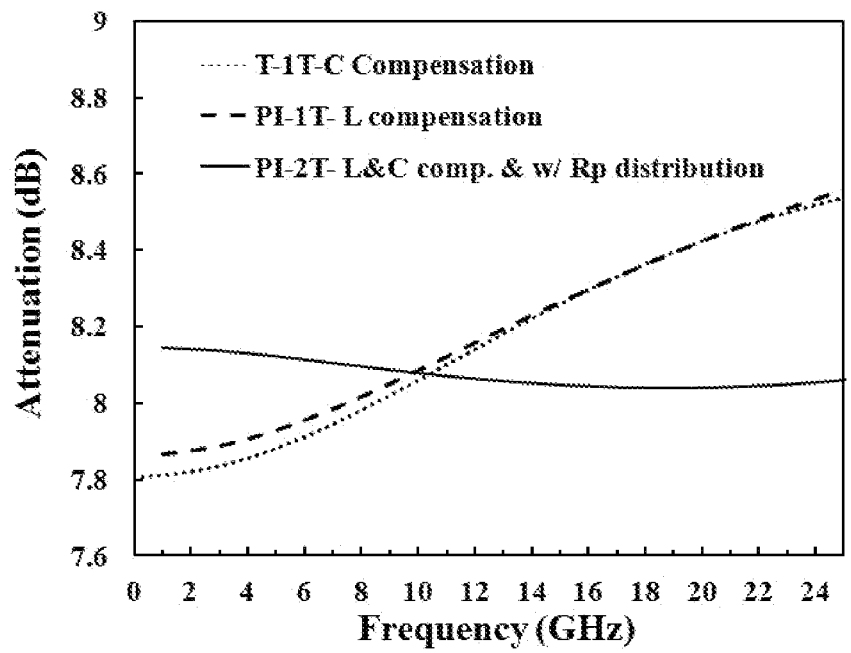
FIGS. 11a and 11b show analysis results of phase variation and attenuation value optimization over frequency for different attenuator topologies.
Figure 11B:
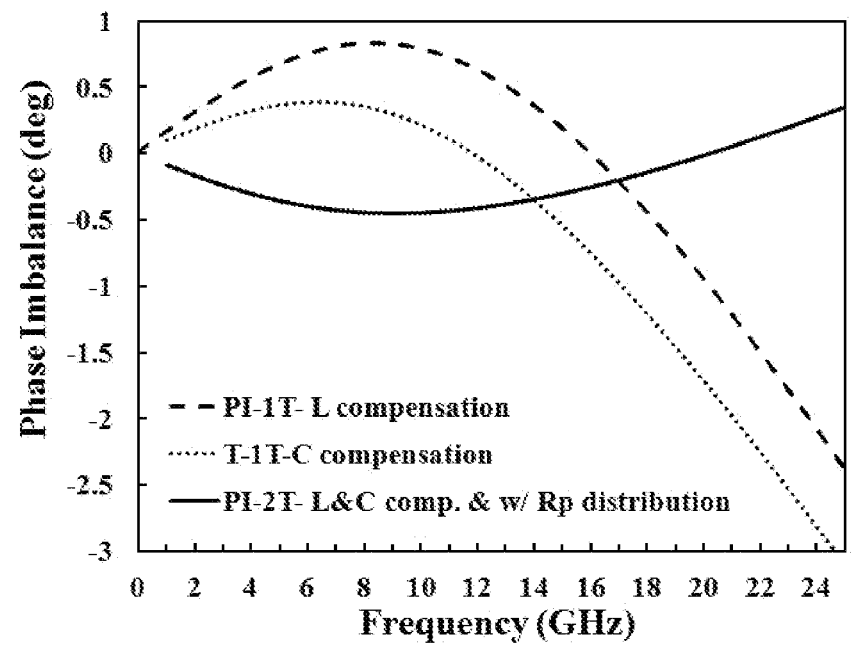

FIGS. 11a and 11b show analysis results of phase variation and attenuation value optimization over frequency for different attenuator topologies. FIG. 11a shows changes in the attenuation value over frequency for three different topologies. T-topology with one transistor $T_2$ and compensation by capacitor Cp (FIG. 3a); π-topology with one transistor $T_2$ in each parallel path and compensation by inductor Ls (FIG. 3b); The new topology with two transistors $Trp_1$ $Trp_2$ and compensation by two resistors Rp1, Rp2 in each parallel path and an optimal combination of Ls and feedback capacitors Cfb (FIG. 7). FIG. 11b shows changes in the phase error (phase imbalance) over frequency for the same three different topologies. As can be seen, attenuation value and phase imbalance over frequency are highly improved. The linearity is improved as well, compared to the other topologies thanks to the existence of the second branch transistor (Trp2).

Figure 12A:
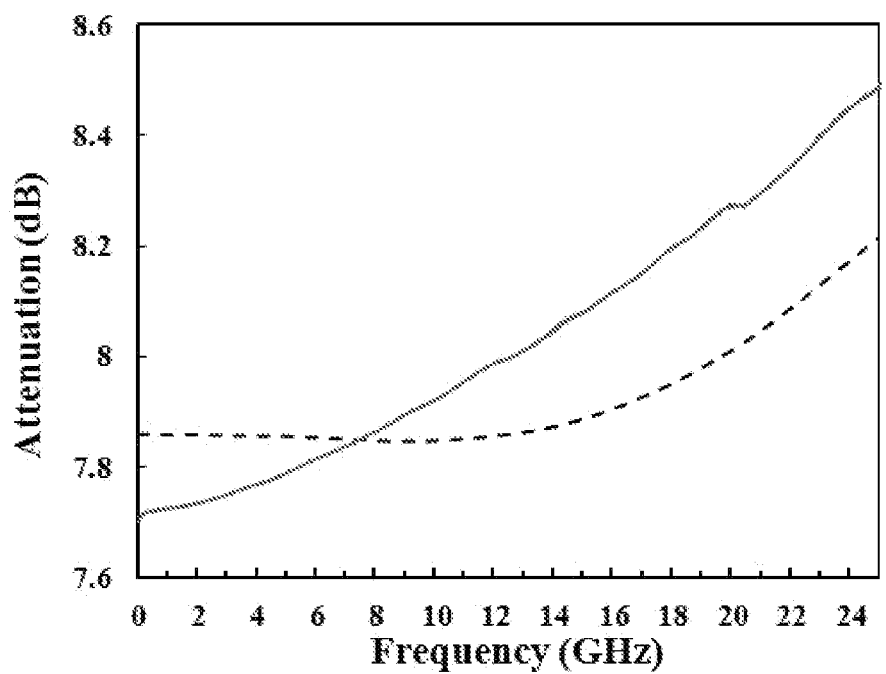
FIGS. 12a and 12b present a comparison between simulation results and measurement results for an 8 dB attenuation bit, that has been realized based on the proposed topology.
Figure 12B:
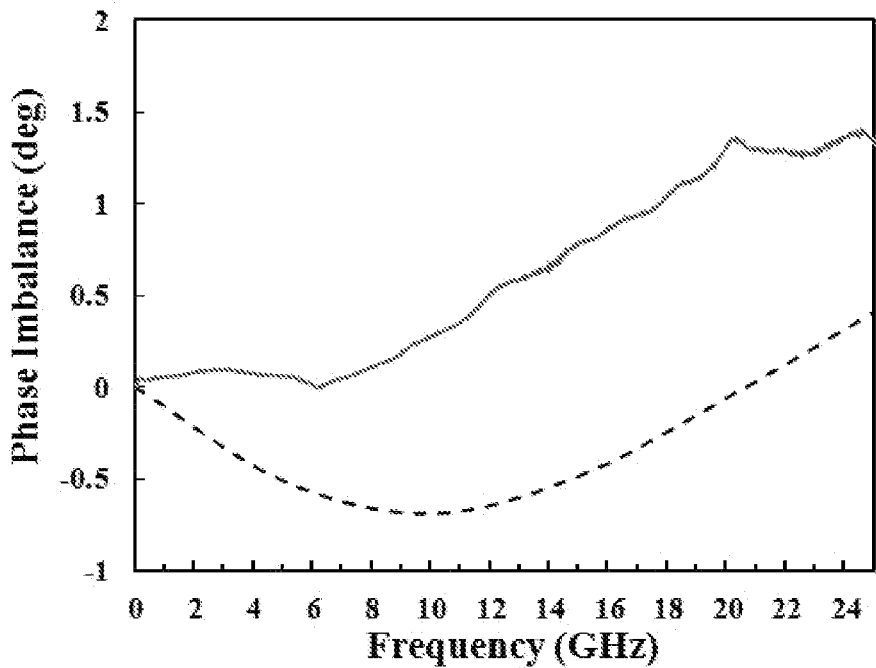

FIGS. 12a and 12b present a comparison between simulation results and measurement results for an 8 dB attenuation bit, that has been realized based on the proposed topology. FIG. 12a shows changes in the attenuation value over frequency. FIG. 12b shows changes in the phase error (phase imbalance) over frequency. The difference between the results is due to the absence of the deep n-well model in the used transistors (CMOS 180 nm).

Figure 1:
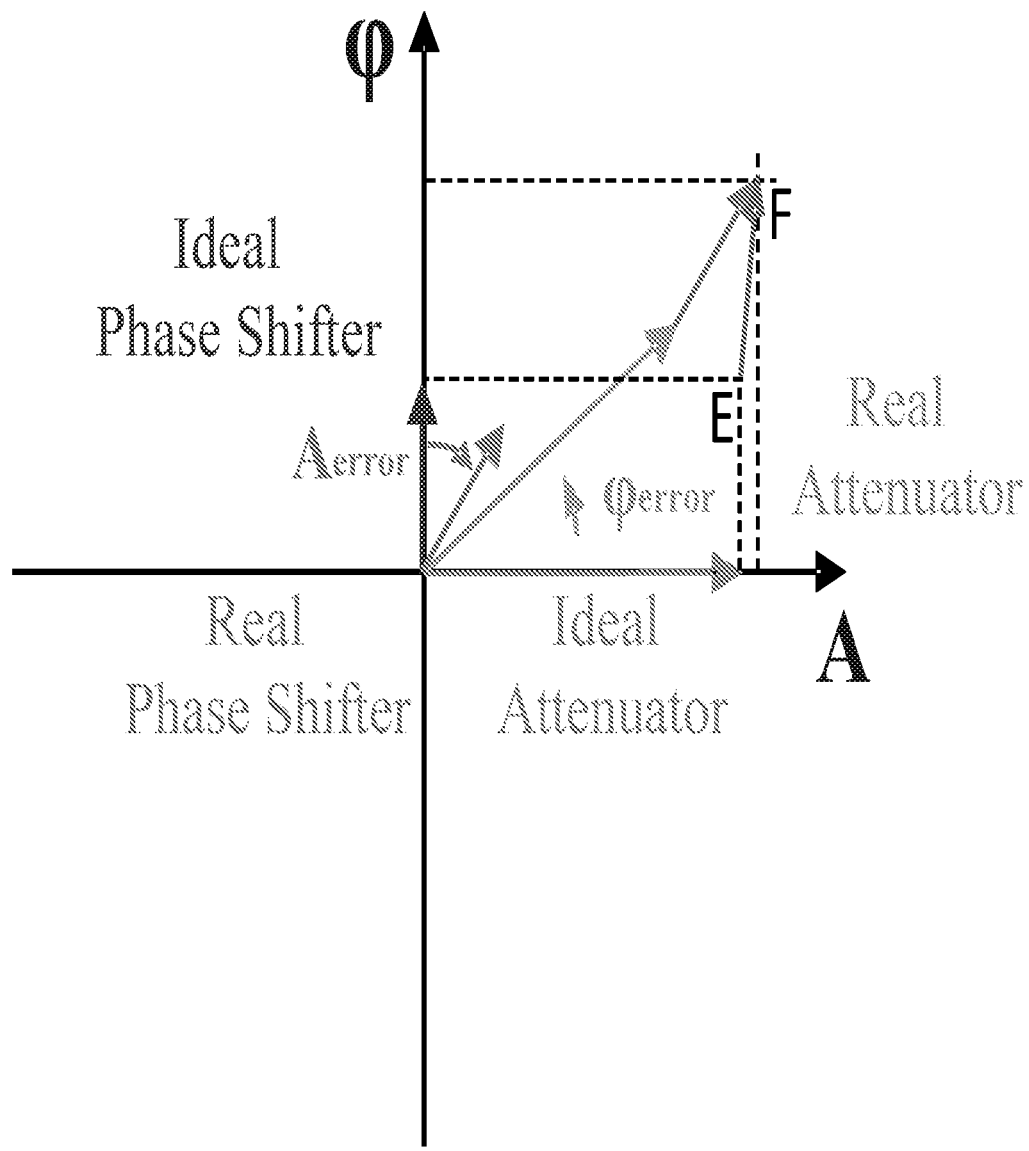
FIG. 1 shows an example of the error introduced when changing an arbitrary phase and amplitude in a phased array channel.
Figure 2:
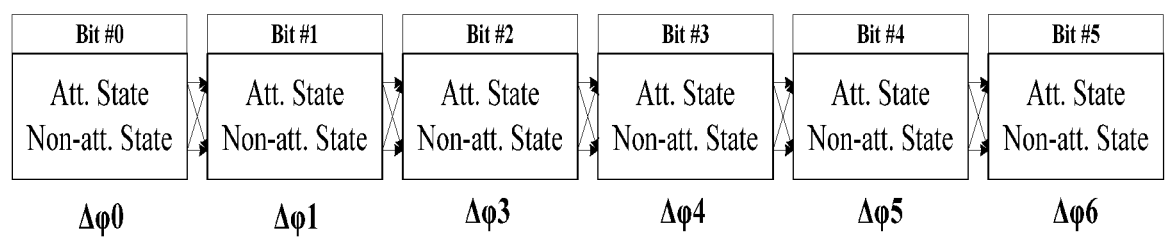
FIG. 2 illustrates the basic architecture of a Digitally-Controlled-Attenuator (DCA)

Using the presented topology and the architecture of FIG. 2, a 24 dB attenuator was realized (8 dB-1 dB-1 dB-4 dB-1 dB-1 dB-8 dB). The proposed topology has a very minor contribution to the overall loss of the attenuator which is mainly caused by the "bridge" or serial transistor performances depending on the technology node (180 nm CMOS in this example).

Figure 13A:
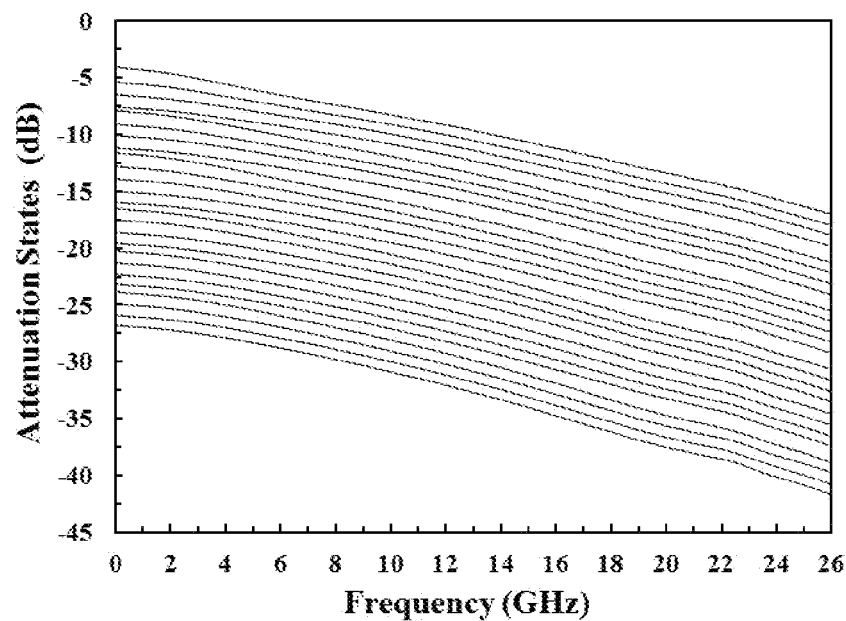
FIGS. 13a and 13b illustrate 24 dB attenuation states and relative attenuation states over frequency, respectively.
Figure 13B:
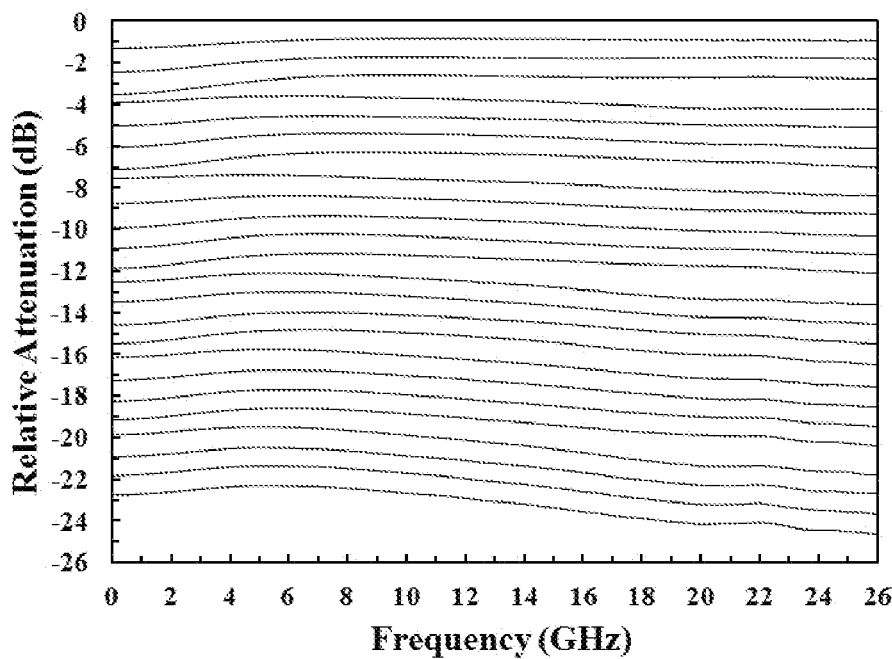

FIGS. 13a and 13b illustrate 24 dB attenuation states and relative attenuation states over frequency, respectively.

Figure 14A:
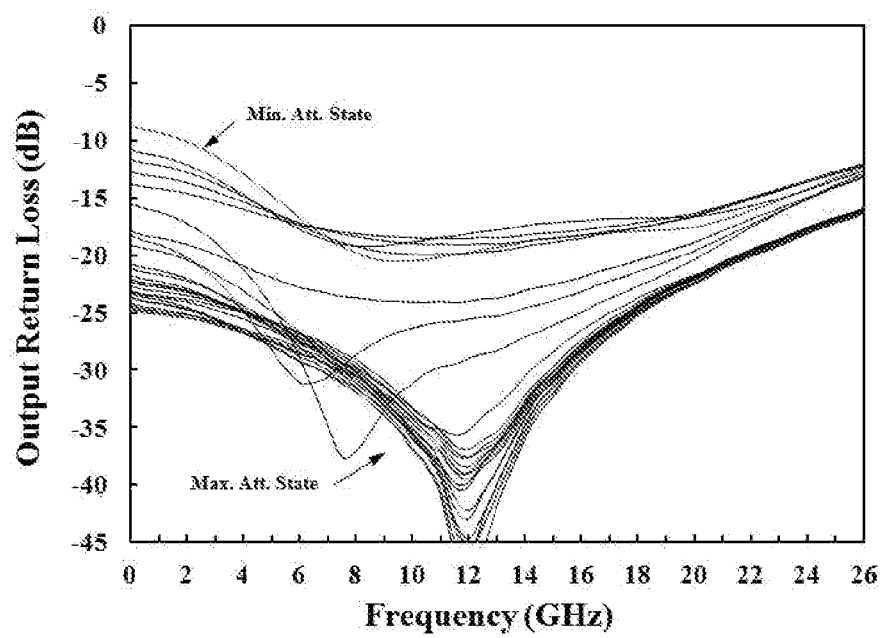
FIGS. 14a and 14b illustrate the input and output Return Loss of the attenuator, respectively, at all different attenuation states.
Figure 14B:
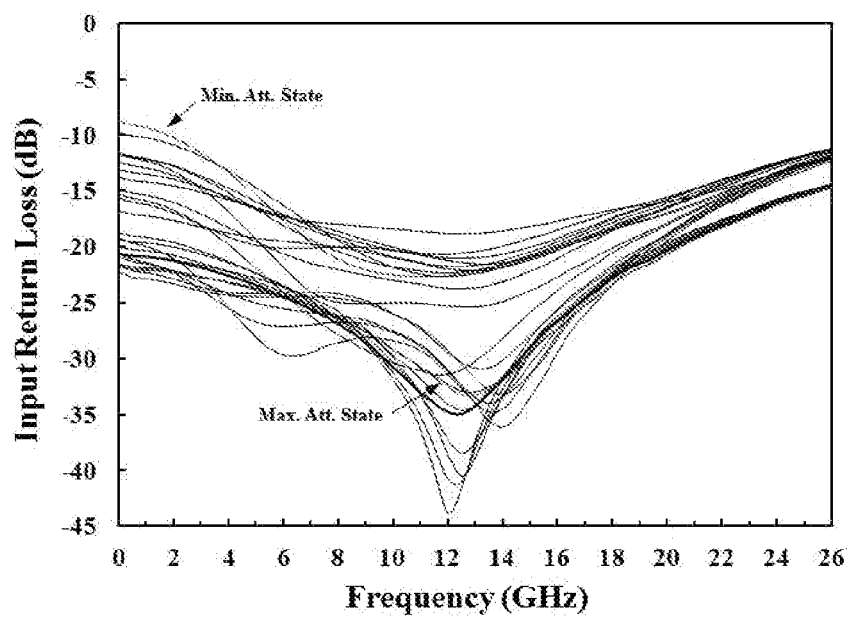

FIGS. 14a and 14b illustrate the input and output Return Loss of the attenuator, respectively, at all different attenuation states.

Figure 15A:
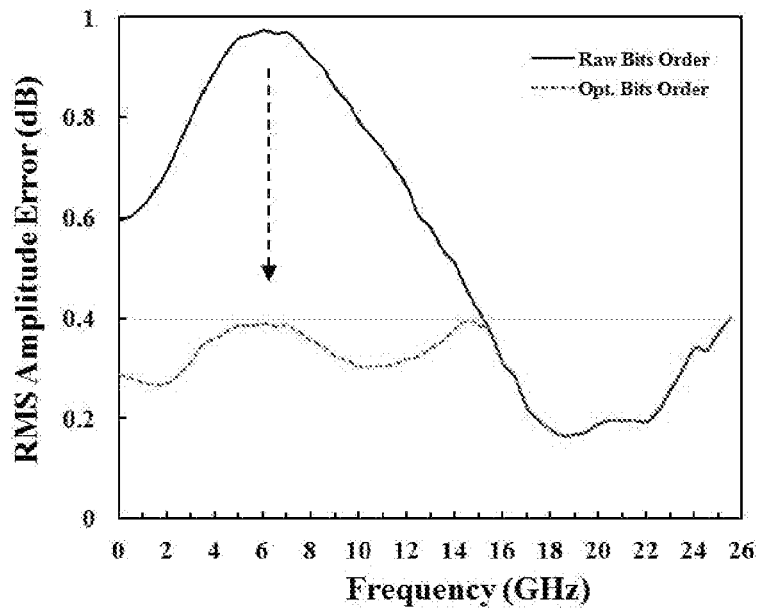
FIGS. 15a and 15b illustrate measurement results of RMS amplitude error, phase variation and RMS phase variation over frequency, respectively, for the 24 dB attenuator.
Figure 15B:
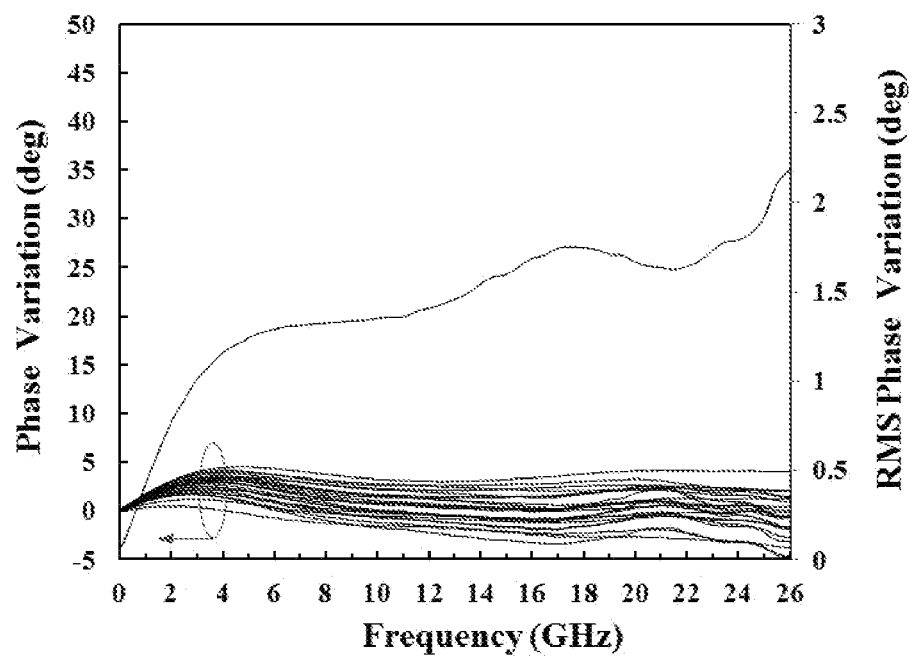

FIGS. 15a and 15b illustrate measurement results of RMS amplitude error, phase variation and RMS phase variation over frequency, respectively, for the 24 dB attenuator.

Figure 16A:
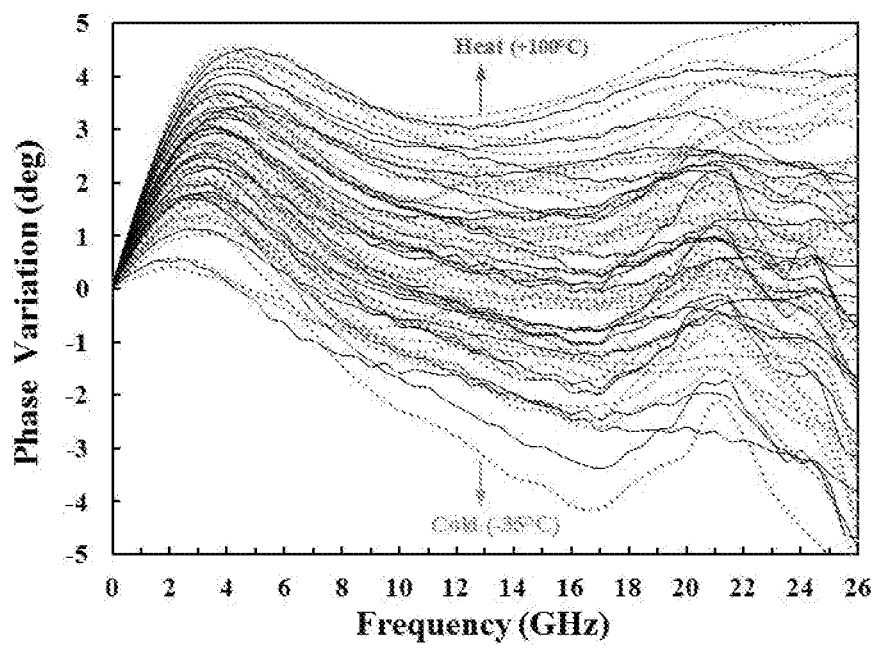
FIGS. 16a and 16b illustrate measurement results of the 24 dB attenuator phase variation over temperature and amplitude error over frequency, both at all attenuation states.
Figure 16B:
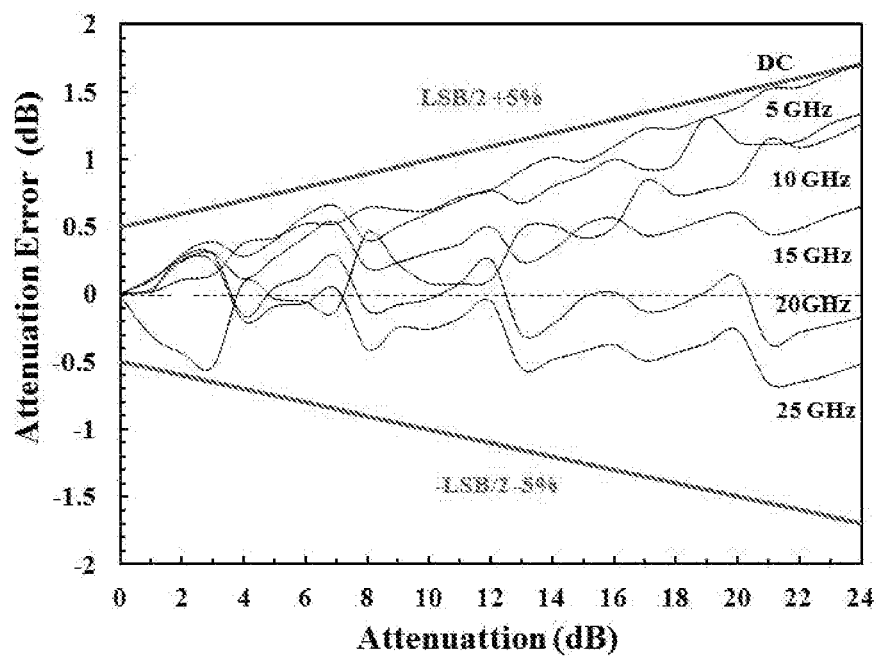

FIGS. 16a and 16b illustrate measurement results of the 24 dB attenuator phase variation over temperature and amplitude error over frequency, both at all attenuation states.

FIG. 13-16 presents the measurement results of the 24 dB attenuator, which has been implemented according to the new topology proposed by the present invention. As can be seen, attenuation values can be kept almost constant from DC-26 GHz. The attenuator has an RMS amplitude error below 0.5 dB with an LSB of only 1 dB. It presents a maximum ±4° phase variation from DC-26 GHz. In addition, the phase variation varies by only ±1° between −35° C. and +100° C. Using the resistor distribution leads to excellent return loss as shown in FIG. 13a-13b, which is an important parameter in accurate phased-array applications. The designed attenuator has an attenuation error from DC-26 GHz, thereby meeting a requirement of ±LSB/2±5%.

It should be mentioned that the proposed topology works for all MOSFET technologies (such as CMOS, SiGe, GaAs, GaN, InP, etc . . . ) and is compatible with as single-ended or differential design.

The above examples and description have of course been provided only for the purpose of illustrations, and are not intended to limit the invention in any way. As will be appreciated by the skilled person, the invention can be carried out in a great variety of ways, employing more than one technique from those described above, including the internet, a cellular network or any other wireless data network, all without exceeding the scope of the invention.

1. REFERENCES

[1] M. Davulcu, C. Caliskan, I. Kalyoncu, M. Kaynak, and Y. Gurbuz, "7-Bit SiGe-BiCMOS Step Attenuator for X-band Phased-Array RADAR Applications.

[2] B.-W. Min, and G. M. Rebeiz, "A 10-50 GHz CMOS distributed attenuator with low loss and low phase imbalance", IEEE JSSS, pp. 2547-2554. November, 2007.

[3] J. Bae, J. Lee, and C. Nguyen, "A 10-67-GHz CMOS dual-function switching-attenuator with improved flatness and large attenuation range", IEEE TMTT, pp. 4118-4128, December, 2013.

[4] B.-H. Ku, and S. Hong, "6-bit CMOS Digital Attenuators With Low Phase Variations for X-band Phased-Array Systems", IEEE TMTT, July, 2010.

[5] U.S. Pat. No. 8,779,870 B2, "Low Phase Variation CMOS Digital Attenuator", Global Froundry, July 2014.

The invention claimed is:

1. A method for improving the stability and reducing phase variations of an ultra-wideband attenuator, with respect to temperature variations, comprising:
   a) providing an attenuator implemented in π- topology and consisting of:
      a.1) a serial path between the input and the output of said attenuator, including a first serial resistor ($Rs_1$) connected to said input, followed by a serial inductor (Ls), followed by a second serial resistor ($Rs_2$) connected to said output;
      a.2) a first transistor ($T_1$) bridging between said input and said output, for controlling the impedance of said serial path by a first control input ($Vc_1$) provided to said first transistor ($T_1$);
      a.3) a first parallel path between said input and ground, including a first parallel transistor ($T_{2a}$) followed by first parallel resistor ($Rp_1$);
      a.4) a second parallel path between said output and ground, including a second parallel transistor ($T_{2b}$) followed by second parallel resistor ($Rp_2$);
      a.5) a second control input ($Vc_2$) commonly provided to first parallel transistor ($T_{2a}$) and to said second parallel transistor ($T_{2b}$), for controlling the impedance of said first and second parallel paths;
   b) rearranging the components in said serial path by unifying said serial resistors to a common serial resistor (Rs) and splitting said serial inductor (Ls) to two serial inductors ($Ls_1$) and ($Ls_2$), such that one serial inductor ($Ls_1$) is connected between said input and a first contract of said common serial resistor (Rs) and the other serial inductor ($Ls_2$) is connected between said output and the other contact of said common serial resistor (Rs);
   c) modifying the components in said first parallel path by splitting the parallel resistor ($Rp_1$) to two smaller resistors ($Rp_{11}$ and $Rp_{12}$), connecting a first smaller resistor ($Rp_{11}$) to the input, connecting a second smaller resistor ($Rp_{12}$) to said to first smaller resistor ($Rp_{11}$) via said first parallel transistor ($T_{2a}$) and to ground via a third parallel transistor ($T_{3a}$);
   d) modifying the components in said second parallel path by splitting the parallel resistor ($Rp_2$) to two smaller resistors ($Rp_{21}$ and $Rp_{22}$), connecting a third smaller resistor ($Rp_{21}$) to the output, connecting a fourth smaller resistor ($Rp_{22}$) to said to third smaller resistor ($Rp_{21}$) via said second parallel transistor ($T_{2b}$) and to ground via a fourth parallel transistor ($T_{3b}$);
   e) connecting a first feedback capacitor ($Cfb_1$) between the common point connecting between the ungrounded port of said second parallel transistor ($T_{3a}$) and the first contract of said common serial resistor (Rs) and connecting a second feedback capacitor ($Cfb_2$) between the common point connecting between the ungrounded port of said fourth parallel transistor ($T_{3b}$) and the second contract of said common serial resistor (Rs);
   f) upon controlling said first and second parallel transistors ($T_{2a}$) and ($T_{2b}$) by said second control input ($Vc_2$), simultaneously controlling also said third and said fourth parallel transistors ($T_{3a}$ and $T_{3b}$) by said second control input ($Vc_2$); and
   g) controlling said first and said second control inputs ($Vc_1$ and $Vc_2$) to obtain a desired attenuation between said input and output of said attenuator.

2. A method according to claim 1, wherein the transistors are implemented using MOSFET technology.

3. A method according to claim 1, wherein the attenuator is implemented using differential or single-ended topology.

4. A method according to claim 1, wherein the circuitry for implementing said attenuator is symmetrical, such that:
   $Rs_1=Rs_2$;
   $Rp_1=Rp_2$;
   first smaller resistor=third smaller resistor;
   second smaller resistor=fourth smaller resistor.

5. A method according to claim 1, wherein optimal performance is obtained when the resistors are split to two equal smaller resistors.

6. A method according to claim 1, wherein the phase imbalance is corrected while the attenuation value decreases.

7. A method according to claim 1, wherein essentially constant attenuation is obtained from DC-26 GHz.

8. An ultra-wideband attenuator with improved stability and reduced phase variations, with respect to temperature variations, comprising:
   a) an attenuator implemented in π- topology consisting of:
      a.1) a serial path between the input and the output of said attenuator, including a first serial resistor ($Rs_1$) connected to said input, followed by a serial inductor (Ls), followed by a second serial resistor ($Rs_2$) connected to said output;
      a.2) a first transistor ($T_1$) bridging between said input and said output, for controlling the impedance of said serial path by a first control input ($Vc_1$) provided to said first transistor ($T_1$);
      a.3) a first parallel path between said input and ground, including a first parallel transistor ($T_{2a}$) followed by first parallel resistor ($Rp_1$);
      a.4) a second parallel path between said output and ground, including a second parallel transistor ($T_{2b}$) followed by second parallel resistor ($Rp_2$);
      a.5) a second control input ($Vc_2$) commonly provided to first parallel transistor ($T_{2a}$) and to said second parallel transistor ($T_{2b}$), for controlling the impedance of said first and second parallel paths;
   b) a common serial resistor (Rs) in said serial path being unification of said serial resistors and two serial inductors ($Ls_1$) and ($Ls_2$), being a division of said serial inductor (Ls), such that one serial inductor (Ls1) is connected between said input and a first contract of said common serial resistor (Rs) and the other serial inductor ($Ls_2$) is connected between said output and the other contact of said common serial resistor (Rs);
   c) a first resistor ($Rp_{11}$) being smaller than ($Rp_1$) connected to the input and a second smaller resistor ($Rp_{12}$) being smaller than ($Rp_1$) connected to said to first smaller resistor ($Rp_{11}$) via said first parallel transistor ($T_{2a}$) and to ground via a third parallel transistor ($T_{3a}$);
   d) a third resistor ($Rp_{21}$) being smaller than ($Rp_2$) connected to the input and a fourth smaller resistor ($Rp_{22}$) being smaller than ($Rp_2$) connected to said third smaller resistor ($Rp_{21}$) via said first parallel transistor ($T_{2b}$) and to ground via a third parallel transistor ($T_{3b}$);
   e) a first feedback capacitor ($Cfb_1$) connected between the common point connecting between the ungrounded port of said second parallel transistor ($T_{3a}$) and the first contract of said common serial resistor (Rs) and a second feedback capacitor ($Cfb_2$) connecting between the common point connecting between the ungrounded port of said fourth parallel transistor ($T_{3b}$) and the second contract of said common serial resistor (Rs);
   f) a controller adapted to control said first and second parallel transistors ($T_{2a}$ and $T_{2b}$) by said second control input (Vc$_2$), to simultaneously control also said third and said fourth parallel transistors (T$_{3a}$ and T$_{3b}$) by said second control input (Vc$_2$), and to control said first and said second control inputs (Vc$_1$ and Vc$_2$) to obtain a desired attenuation between said input and output of said attenuator.

9. An ultra-wideband attenuator according to claim 8, in which the transistors are implemented using MOSFET technology.

10. An ultra-wideband attenuator according to claim 8, implemented using differential or single-ended topology.

11. An ultra-wideband attenuator according to claim 8, in which the circuitry for implementing said attenuator is symmetrical, such that:

Rs$_1$=Rs$_2$;
Rp$_1$=Rp$_2$;
first smaller resistor=third smaller resistor;
second smaller resistor=fourth smaller resistor.

12. An ultra-wideband attenuator according to claim 8, in which optimal performance is obtained when the resistors are split into two equal smaller resistors.

13. An ultra-wideband attenuator according to claim 8, in which the phase imbalance is corrected while the attenuation value decreases.

14. An ultra-wideband attenuator according to claim 8, in which essentially constant attenuation is obtained from DC-26 GHz.

\* \* \* \* \*